(12) United States Patent
Vincent et al.

(10) Patent No.: US 8,137,764 B2
(45) Date of Patent: Mar. 20, 2012

(54) MECHANICAL ENHANCER ADDITIVES FOR LOW DIELECTRIC FILMS

(75) Inventors: Jean Louise Vincent, Bethlehem, PA (US); Mark Leonard O'Neill, Allentown, PA (US); Raymond Nicholas Vrtis, Orefield, PA (US); Aaron Scott Lukas, Lansdale, PA (US); Brian Keith Peterson, Fogelsville, PA (US); Mark Daniel Bitner, Nazareth, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 1534 days.

(21) Appl. No.: 10/842,503

(22) Filed: May 11, 2004

(65) Prior Publication Data

US 2004/0241463 A1 Dec. 2, 2004

Related U.S. Application Data

(60) Provisional application No. 60/474,266, filed on May 29, 2003.

(51) Int. Cl.
 *C23C 10/06* (2006.01)
 *C23C 16/24* (2006.01)
(52) U.S. Cl. ........................ 427/588; 428/447
(58) Field of Classification Search .................. 427/588; 428/447
 See application file for complete search history.

(56) References Cited

U.S. PATENT DOCUMENTS

| | | | |
|---|---|---|---|
| 5,989,998 A | 11/1999 | Sugahara et al. | |
| 6,054,206 A | 4/2000 | Mountsier | |
| 6,054,379 A | 4/2000 | Yau et al. | |
| 6,068,884 A | 5/2000 | Rose et al. | |
| 6,132,814 A | 10/2000 | Livesay et al. | |
| 6,147,009 A | 11/2000 | Grill et al. | |
| 6,159,871 A | 12/2000 | Loboda et al. | |
| 6,159,897 A | 12/2000 | Suzuki et al. | |

(Continued)

FOREIGN PATENT DOCUMENTS

EP 0 935 283 A2 2/1999

(Continued)

OTHER PUBLICATIONS

L. Peters, "Low-k Dielectrics Pose New Reliability Concerns," Semiconductor International (2003).

(Continued)

*Primary Examiner* — Michael Cleveland
*Assistant Examiner* — Robert Vetere
(74) *Attorney, Agent, or Firm* — Rosaleen P. Morris-Oskanian; Joseph D. Rossi

(57) ABSTRACT

A chemical vapor deposition process for preparing a low dielectric constant organosilicate (OSG) having enhanced mechanical properties by adjusting the amount of organic groups, such as methyl groups, within the mixture is disclosed herein. In one embodiment of the present invention, the OSG film is deposited from a mixture comprising a first silicon-containing precursor that comprises from 3 to 4 Si—O bonds per Si atom, from 0 to 1 of bonds selected from the group consisting of Si—H, Si—Br, and Si—Cl bonds per Si atom and no Si—C bonds and a second silicon-containing precursor that comprises at least one Si—C bond per Si atom. In another embodiment of the present invention, the OSG film is deposited from a mixture comprising an asymmetric silicon-containing precursor. In either embodiment, the mixture may further contain a porogen precursor to provide a porous OSG film.

36 Claims, 5 Drawing Sheets

C/Si = 0/1

U.S. PATENT DOCUMENTS

| | | | |
|---|---|---|---|
| 6,171,945 | B1 | 1/2001 | Mandal et al. |
| 6,204,201 | B1 | 3/2001 | Ross |
| 6,207,555 | B1 | 3/2001 | Ross |
| 6,238,751 | B1 | 5/2001 | Mountsier |
| 6,287,990 | B1 | 9/2001 | Cheung et al. |
| 6,303,523 | B2 | 10/2001 | Cheung et al. |
| 6,316,063 | B1 | 11/2001 | Andideh et al. |
| 6,331,494 | B1 | 12/2001 | Olson et al. |
| 6,340,628 | B1 | 1/2002 | VanCleemput et al. |
| 6,383,955 | B1 | 5/2002 | Matsuki et al. |
| 6,407,006 | B1 * | 6/2002 | Levert et al. ............ 438/761 |
| 6,410,463 | B1 | 6/2002 | Matsuki |
| 6,440,874 | B1 | 8/2002 | Shields |
| 6,448,186 | B1 | 9/2002 | Olson et al. |
| 6,475,564 | B1 | 11/2002 | Carter et al. |
| 6,486,082 | B1 | 11/2002 | Cho et al. |
| 6,497,963 | B1 | 12/2002 | Grill et al. |
| 6,583,048 | B1 | 6/2003 | Vincent et al. |
| 7,098,149 | B2 * | 8/2006 | Lukas et al. ............ 438/778 |
| 7,446,055 | B2 | 11/2008 | Weigel et al. |
| 2001/0034140 | A1 | 10/2001 | Shioya et al. |
| 2001/0055672 | A1 | 12/2001 | Todd |
| 2001/0055891 | A1 * | 12/2001 | Ko et al. ............ 438/780 |
| 2002/0013060 | A1 | 1/2002 | Shioya et al. |
| 2002/0037442 | A1 | 3/2002 | Grill et al. |
| 2002/0105085 | A1 | 8/2002 | Furusawa et al. |
| 2002/0142104 | A1 * | 10/2002 | Nemani et al. ............ 427/489 |
| 2002/0142579 | A1 | 10/2002 | Vincent et al. |
| 2002/0142585 | A1 | 10/2002 | Mandal |
| 2002/0160626 | A1 | 10/2002 | Matsuki et al. |
| 2002/0172766 | A1 | 11/2002 | Laxman et al. |
| 2002/0180051 | A1 | 12/2002 | Grill et al. |
| 2003/0032305 | A1 | 2/2003 | Yau et al. |
| 2003/0049460 | A1 | 3/2003 | O'Neill et al. |
| 2003/0139062 | A1 | 7/2003 | Grill et al. |
| 2003/0143865 | A1 | 7/2003 | Grill et al. |
| 2004/0101633 | A1 * | 5/2004 | Zheng et al. ............ 427/551 |
| 2005/0048795 | A1 | 3/2005 | Ko et al. |

FOREIGN PATENT DOCUMENTS

| | | |
|---|---|---|
| EP | 1 119 035 A2 | 11/2000 |
| EP | 1 123 991 A2 | 2/2001 |
| EP | 1 354 980 A1 | 10/2003 |
| EP | 1 482 550 | 12/2004 |
| JP | 2001-274153 A | 5/2001 |
| JP | 2001-274153 A | 10/2001 |
| JP | 2002-256434 A | 9/2002 |
| JP | 2003-007699 A | 1/2003 |
| TW | 540118 | 3/1990 |
| WO | WO 99/38202 | 7/1999 |
| WO | WO 99/41423 | 8/1999 |
| WO | WO 00/24050 | 4/2000 |
| WO | WO 02/43119 A2 | 5/2002 |
| WO | WO 2004/083495 | 9/2004 |
| WO | WO 2005/019303 | 3/2005 |

OTHER PUBLICATIONS

L. Peters, "Removing Barriers to Low-k Dielectric Adoption," Semiconductor International (2002).

M. O'Neill, et al., "Low-k Materials by Design," Semiconductor International (2002).

Dixit, Girish, et al., "Film Properties and Integration Performance of a Nano-Porous Carbon Doped Oxide", Applied Materials, Inc, Santa Clara, California, USA, International Interconnect Technology Conference, Jun. 2004.

Grill, et al., "Ultralow-k Dielectrics Prepared by Plasma-Enhanced Chemical Vapor Deposition", Applied Physics Letters, vol. 79, No. 6, Aug. 6, 2001, pp. 803-805.

Grill, et al., "Low Dielectric Constant SiCOH Films as Potential Candidates for Interconnect Dielectrics", Mat. Res. Soc. Symp. Proc., vol. 565, 1999, pp. 107-116.

S.P. Murarka et al, Interlayer Dielectrics for Semiconductor Technologies, Elsevier Academic Press 2003, p. 269.

M.L. O'Neill et al, Optimized materials properties for organosilicate glasses produced by plasma-enhanced chemical vapor deposition, Mat. Res. Soc. Symp. Proc., vol. 766, 2003, pp. E8.17.1-E8.17.6.

Vrtis, et al.; "Deposition of a Porous Insulating Film With a Dielectric Constant of 2.5 or Below"; U.S. Appl.. No. 60/373,104; Apr. 17, 2002.

O'Neill, M., et al; "Impact of Porogen Precursor on Film Properties and Morphology of Porous Organosilicate Glasses for Integrated Circuit Manufacturing".

Lin, S., et al.; "Low-k Dielectrics Characterization for Damascene Integration"; pp. 146-148, (2001).

Chattopadhyay, S., et al.; "Electron Beam Modification of Themoplastic Elastomeric Blends made from Polyolefins"; Journal of Materials Science; vol. 36; 2001; pp. 4323-4330.

Kloster, G., et al.; "Porosity Effects on Low-k Dielectric Film Strength and Interfacial Adhesion"; pp. 242-244.

Wang, S., et al.; "Advanced Processing: CMP of Cu/low-k and Cu/ultralow-k Layers".

* cited by examiner

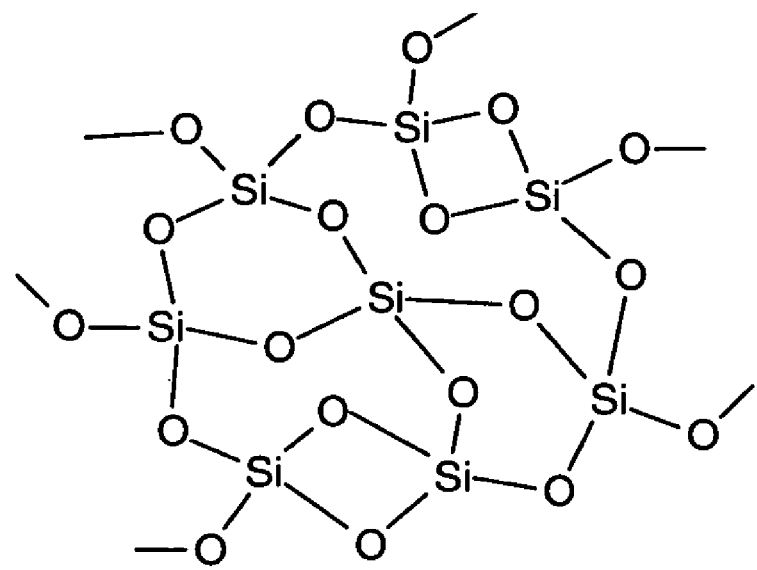
FIGURE 1: C/Si = 0/1
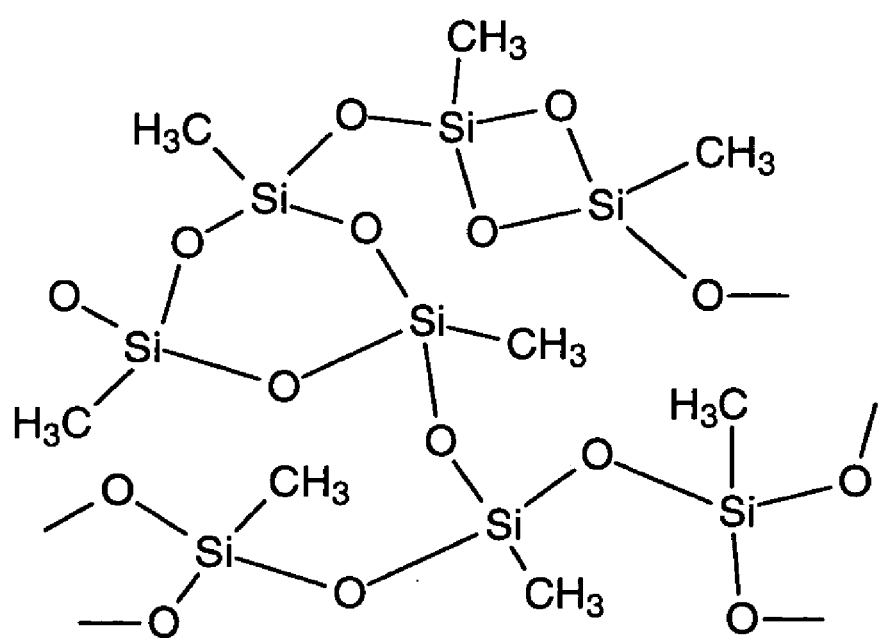
FIGURE 2: C/Si = 1/1

MECHANICAL ENHANCER ADDITIVES FOR LOW DIELECTRIC FILMS

CROSS-REFERENCE TO RELATED APPLICATIONS

This application claims the benefit of U.S. Provisional Application No. 60/474,266, filed 29 May 2003.

BACKGROUND OF THE INVENTION

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. C is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and 02 have a dielectric constant (k) of 4.0.

There are several ways in which industry has attempted to produce silicate-based CVD films with lower dielectric constants. One effective way to produce a lower dielectric constant film has been to dope a silicon oxide film with organic groups. The resultant film may have a dielectric constant that ranges from 2.7 to 3.5. These doped films, referred to herein as organosilicate "OSG") films, are typically deposited as a dense film (density~1.5 g/cm$^3$) from an organosilicon precursor and an oxidant.

OSG films may be deposited by a chemical vapor deposition (CVD) process. In a typical CVD process, precursor gases are flowed into a reaction chamber, activated, and a material is deposited on a substrate inside the chamber. The activation of the precursors may occur by using an energy source such as, for example, a thermal or a RF-coupled plasma source. The chemical vapor deposition of an OSG material can be accomplished using a variety of precursors. Examples of commonly used precursors are organosilanes containing methyl groups such as mono-through tetramethylsilane, dimethyidimethoxysilane, diethoxymethylsilane, octamethylcyclotetrasiloxane, and/or tetramethylcyclotetrasiloxane. Plasma-enhanced chemical vapor deposition (PECVD) is the most commonly used CVD process to react methyl-containing organosilanes to form OSG materials. OSG films produced by PECVD processes typically contain from 10 to 40% atomic carbon and dielectric constants that range from 2.7 to 3.2, although lower dielectric constant values can be achieved if the film is made porous. As industry demands for films having dielectric constant values below 2.7 due to higher device densities and smaller dimensions have increased, the industry has turned to various porous materials for improved insulating properties.

The implementation of OSG materials as ILD's in IC's has hit several stumbling blocks. One major hurdle is the reduced mechanical properties of the OSG material over the traditional silica ($SiO_2$). Mechanical properties of an ILD are typically reported by nanoindentation in gigapascals (GPa) as hardness (H) or Young's modulus. The hardness is a measure of the applied force required to indent the film whereas Young's modulus is the elastic response of the material to the applied force or compression. Silica has a hardness that may range from 8 to 10 GPa. By contrast, an OSG material has a hardness that may range from 0.1 to 5 GPa, depending on the dielectric constant and the process conditions at which the material was deposited. Mechanical strength is needed for subsequent processing steps such as etching, chemical mechanical planarization "CMP") processing, and depositing additional layers such as diffusion barriers for copper, copper metal ("Cu"), and cap layers on the product. In some of these processes, temperature cycling of multiple layers may induce stresses due to the coefficient of thermal expansion mismatch between the different materials thereby causing cracking or delamination. Surface planarity is also required and may be maintained through controlling processing parameters such as those during the film formation process and through CMP. Mechanical integrity, stiffness, compressive, and shear strengths may be particularly important to survive CMP. These mechanical properties are also important in the packaging of the final product.

The amount of organic groups chemically incorporated into the material affects both the dielectric constant and the mechanical strength. Mechanical strength reduction observed for OSG films, when compared to a $SiO_2$ film that does not contain organic groups, may be partially attributed to the disruption in the silica network by the introduction of terminal organic groups. One way of describing the network disruption is by using the ratio of the number of carbon atoms in the film (assuming the carbon is substantially present as methyl groups or as methylene species) to the number of silicon atoms in the film and which is referred to herein as the C/Si ratio. FIGS. 1 and 2 provide an illustration of the network for a silica film and an OSG film having a C/Si ratio of 0 and 1, respectively. It is believed that the more organic groups that are contained within the film, the less silicon sites are available for Si—O networking which may lower the corresponding hardness. However, if there are too few organic groups within the film, the dielectric constant may be adversely affected. For example, the benefit of adding organic groups to lower the dielectric constant diminishes with increasing amounts of organic groups within the film.

One way to reduce the C/Si ratio in the deposited film, and thus increase the hardness, is to vary the deposition process conditions. In general, higher energy conditions, such as higher temperatures and/or higher plasma powers, result in more Si—C bond cleavage during the CVD or PECVD reaction. However, there are cases when more energetic conditions cannot be employed because the distribution of certain desirable bonds, such as C—H or C—C, will be adversely affected. These highly energetic conditions may also make it more difficult to produce a porous OSG film.

Another process to reduce the C/Si ratio may be through post treatment, which may be thermal, plasma, and/or other treatments under a certain atmosphere such as, for example, $O_2$. In certain instances, it may be undesirable to conduct a post-treatment step because it can add to the processing time of each wafer and potentially damage adjacent laminate layers within an integrated circuit.

BRIEF SUMMARY OF THE INVENTION

Low dielectric constant materials and films and chemical vapor deposition-based processes to prepare same are described herein. In one aspect, there is provided a process for making an organosilicate glass film having a dielectric constant of 4.0 or less comprising: providing a mixture that is one selected from the following: the mixture (i) comprising a first silicon-containing precursor that comprises from 3 to 4

Si—O bonds per Si atom, from 0 to 1 of a bond selected from the group consisting of Si—H, Si—Br, and Si—Cl bonds per Si atom, and no Si—C bonds, and a second silicon-containing precursor that comprises at least one Si—C bond per Si atom; and the mixture (ii) comprising an asymmetric silicon-containing precursor having a number ratio of Si—C bonds to Si atoms that is less than 1; introducing the mixture into a reaction chamber having a substrate contained therein; and applying energy to the mixture in the reaction chamber to induce reaction and deposit the organosilicate glass film on the substrate.

In another aspect, there is provided a process for making a porous organosilicate glass film having a dielectric constant of 3.0 or less, the process comprising: providing within a plasma enhanced chemical vapor deposition reaction chamber a substrate and a mixture comprising: a first silicon-containing precursor comprising from 3 to 4 Si—O bonds per Si atom, from 0 to 1 of a bond selected from the group consisting of Si—H, Si—Br, and Si—Cl bonds per Si atom, and no Si—C bonds; a second silicon-containing precursor comprising at least one Si—C bond per Si atom; and a porogen precursor; applying energy to the mixture in the reaction chamber to induce reaction and deposit a film on the substrate; and treating the deposited film with at least one energy source selected from thermal, photon, electron, plasma, microwave, and chemical energy to remove at least a portion of the porogen precursor and provide the porous organosilicate glass film.

In a further aspect of the present invention, there is provided a process for making a porous organosilicate glass film having a dielectric constant of 3.0 or less and a C/Si ratio of 1 or less comprising: providing within a plasma enhanced chemical vapor deposition reaction chamber a substrate and a mixture comprising an asymmetric silicon-containing precursor having a ratio of Si—C bonds to Si atoms of less than one, and a porogen precursor; applying energy to the mixture in the reaction chamber to induce reaction and deposit a film on the substrate; and treating the deposited film with at least one energy source selected from thermal, photon, electron, plasma, microwave, and chemical energy to remove at least a portion of the porogen precursor and provide the porous organosilicate glass film.

In yet another aspect of the present invention, there is provided a mixture for making a porous organosilicate glass film having a dielectric constant of 3.0 or less comprising: a first silicon-containing precursor comprising from 3 to 4 Si—O bonds per Si atom, from 0 to 1 of bonds selected from the group consisting of Si—H, Si—Br, and Si—Cl bonds per Si atom and no Si—C bonds; a second silicon-containing precursor comprising at least one Si—C bond wherein an amount of the first and second silicon-containing precursors are independently at least 10 mole percent of a total amount of silicon-containing precursor within the mixture; and a porogen precursor.

These and other aspects of the present invention will be more apparent from the following description.

BRIEF SUMMARY OF THE DRAWINGS

FIG. 1 provides an illustration of a fully networked $SiO_2$ material with a C/Si ratio of 0.

FIG. 2 shows an illustration of an OSG material with a C/Si ratio of 1 and all of the carbon incorporated as methyl groups.

DETAILED DESCRIPTION OF THE INVENTION

Figure 3:
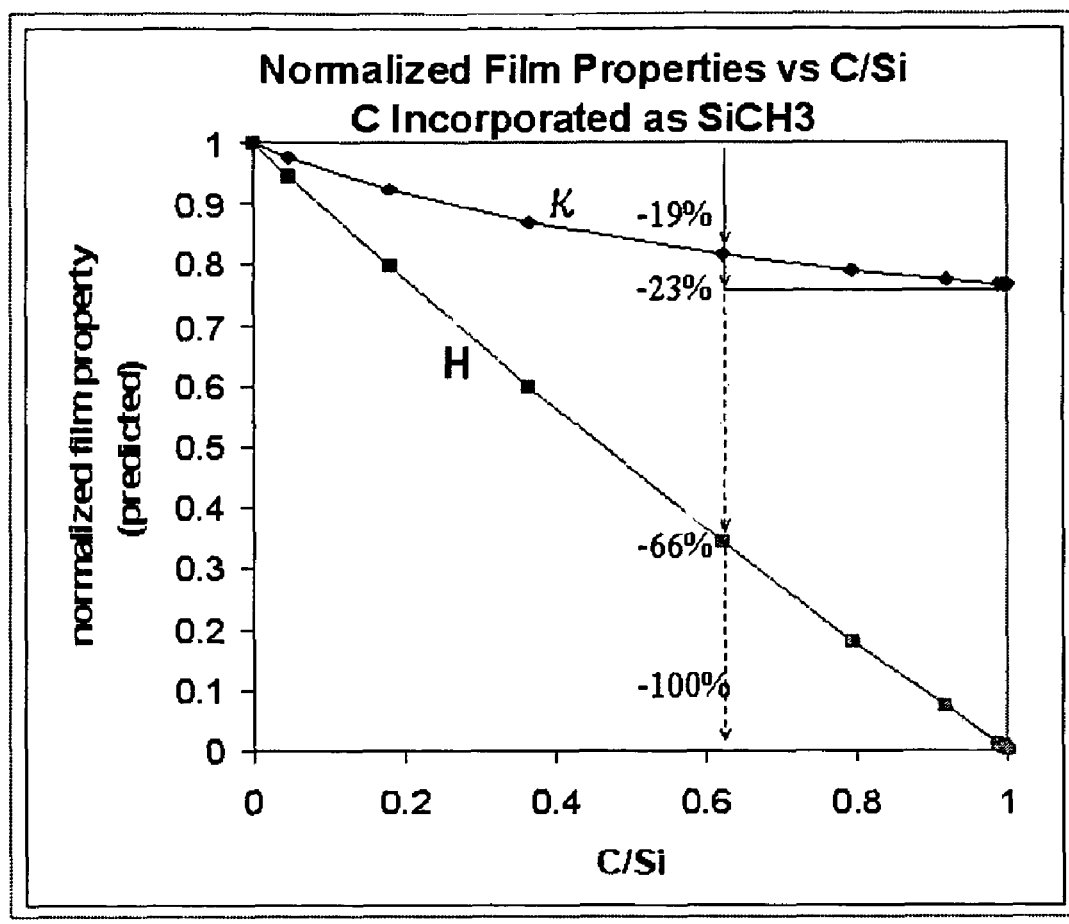
FIG. 3 illustrates the predicted relationship between dielectric constant and hardness as the C/Si ratio of a material is increased, with all of the parameters normalized to those of $SiO_2$, and assuming that all of the C is incorporated into material as methyl groups attached to silicon.

A process for preparing a low dielectric constant (i.e., 4.0 or less) organosilicate glass (OSG) material and films comprising same is disclosed herein. In certain embodiments, the low dielectric constant OSG materials and films have an engineered porosity, by incorporating a porogen precursor into the mixture or precursors that ranges from 0 to 80%. Low dielectric constant OSG having enhanced mechanical properties such as hardness can be deposited by controlling the Si—C/Si ratio in a mixture comprising one or more precursors rather then relying solely on deposition conditions and/or post-treatments. It is believed that controlling the composition of the mixture of precursors prior to and/or during deposition allows for an OSG material that exhibits improved mechanical properties, thermal stability, and chemical resistance (to oxygen, aqueous oxidizing environments, etc.) at a certain dielectric constant. In certain embodiments, the process described herein may be particularly useful when a high deposition temperature of 300° C. or greater is not allowable. In these embodiments, the process described herein may be advantageous, for example, for the co-deposition of OSG/organic polymer films, porous OSG films, and OSG films in which thermally unstable groups are to be incorporated.

Although not intending to be bound by theory, it is believed that the density of the material should be reduced in order to lower the dielectric constant of a Si—O based material or film below 4.0. One way to lower the dielectric constant below 4.0 and reduce the material density is by adding one or more organic groups into the structure of the OSG material. Films that have one or more organic groups incorporated into the structure may have a density of 2.2 g/ml or less, 1.5 g/ml or less, or 1.25 g/ml or less. In certain embodiments, the majority of organic groups that are incorporated into the film are methyl groups (—$CH_3$). However, after a certain concentration of organic groups in the film is reached, additional organic groups may not significantly decrease the dielectric constant. Indeed, the mechanical properties may decrease as more organic groups are added.

In alternative embodiments, the dielectric constant of the material or film may be lowered to 3.0 or below, and the density of the film is consequently reduced, by adding void volume or pores to the film. In these embodiments, the material or film may be deposited from a mixture of silicon-containing precursors that further comprises a porogen precursor. Porous films may have a density of 1.5 g/ml or less, or 1.25 g/ml or less, or 1.0 g/ml or less. A "porogen", as used herein, is a reagent that is used to generate void volume within the resultant film. During the deposition process, the silicon-containing and porogen precursors are chemically activated and co-deposit on a substrate surface to form a composite organosilicate material. As a result of the chemical activation, the porogen precursor may polymerize to form a species of higher molecular weight than the precursor itself. The term "polymerize", as used herein, refers to a process in which the polymer is formed by the reaction/combination of these ions, radicals and fragments after the monomers or oligomers of the precursors are ionized and fragmented by the plasma and/or other energy source as well as processes in which the polymer is formed by the repetitive addition of monomer units in a regimented or random order. After deposition, the porogen can be removed from the composite organosilicate material by the introduction of an energy source such as, but not limited to, thermal, photo, electron, and combinations thereof. This treatment may be carried out at one or more pressures ranging from vacuum to ambient atmosphere, and under inert, oxidizing, or reducing conditions. The removal of at least a portion of the porogen results in a porous organosilicate material. In these embodiments, the degree of porosity and/or the dielectric constant of the resultant film may be affected by the ratio of silicon-containing precursor to porogen precursor within the mixture of precursors.

FIG. 3 provides an illustration of the predicted hardness and dielectric constant for a non-porous $SiO_2$ film in which increasing amounts of methyl groups have been added. The hardness may be predicted by applying the theory of Boolchand et al. (P. Boolchand, M. Zhang, B. Goodman, Phys. Rev. B, 53, 11488, 1996) to methyl groups rather than atoms and examining the effect of terminal methyl groups on mechanical properties. The dielectric constant may be predicted via a group contribution method, which predicts the dielectric constant for polymers and for three-dimensionally connected amorphous materials. The hardness (assumed proportional to the elastic modulus) and dielectric constant can be normalized to that of hydroxyl-free silica, which has a dielectric constant of 3.8 and a modulus of 72 GPa. Using these values, FIG. 3 shows that the dielectric constant drops 19% when the C/Si ratio in the film is increased from 0 to approximately 0.6, with a corresponding 66% decrease in hardness. However, increasing the C/Si ratio further to 1 results in only an additional 4% decrease in dielectric constant, while the hardness approaches zero. Therefore, it may be desirable to have a means to limit the percentage of Si atoms substituted with organic groups. Consequently, this may maximize the mechanical properties for a given dielectric constant. This may be particularly important for porous OSG films.

Low dielectric constant OSG films having desirable mechanical properties are prepared from a mixture of precursors that contains one or more silicon-containing precursors and optionally one or more porogen precursors. The resultant film deposited from this process contains Si, O, C, and H and has a dielectric constant of 4 or less. In one embodiment, the OSG film is deposited from a mixture comprising a first silicon-containing precursor having three to four Si—O bonds per Si atom, zero to one of either a Si—H, Si—Cl, or Si—Br bond per Si atom, and no Si—C bonds, and a second silicon-containing precursor having at least one Si—C bond per Si atom. In these embodiments, the resultant OSG film has a carbon content that is at least about 2 atomic % less than and a hardness that is at least 10% greater than the carbon content and hardness measured on a comparable OSG film that is deposited from a mixture that does not contain the first silicon-containing precursor. In certain embodiments, the second silicon-containing precursor contains Si—C bonds in the form of Si—$CH_3$ or methyl groups. An example of a suitable mixture contains the first silicon-containing precursor triethoxysilane ("TES") ($CH_3CH_2O)_3SiH$) and the second silicon-containing precursor diethoxymethylsilane ("DEMS") ($CH_3CH_2O)_2Si(CH_3)H$). Yet another example of a suitable precursor mixture contains the first silicon-containing precursors, tetramethoxysilane and triethoxysilane, and the second silicon-containing precursors, diethoxymethylsilane and methyltriethoxysilane.

In certain embodiments, the majority of the carbon contained in the OSG film is provided by the second silicon-containing precursor. The ratio of first silicon-containing precursor to second silicon-containing precursor may be adjusted for the desired carbon content, dielectric constant, and mechanical properties of the OSG film. The first and second silicon-containing precursors can be delivered to the reaction chamber as a prepared mixture such as, for example, by mixing the precursors prior to use, or alternatively, delivered to the reaction chamber through a plurality of separate lines and mixed within the reaction chamber.

The first silicon-containing precursor has three to four Si—O bonds, zero or one Si—H, Si—Cl, or Si—Br bond, and no Si—C bonds. The Si—O bonds in the first silicon-containing precursor of the first embodiment may take the form of silanols (e.g. Si—OH), alkoxysilanes (e.g. Si—$OCH_2CH_3$), or acetoxysilanes (e.g. $SiO(OC)CH_3$). In embodiments wherein the first silicon-containing precursor contains one bond selected from Si—H, Si—Cl or Si—Br, the aforementioned bonds may activate easily during deposition. In these embodiments, Si—Cl or Si—Br bonds will be broken during deposition and substantially no Cl and Br will be incorporated into the resultant film. The first silicon-containing precursor may be a compound represented by the following formulas: $HSi(OR^1)_3$, wherein $OR^1$ is independently a OH, a $C_1$ to $C_8$ linear or branched alkoxy or an acetate group and $Si(OR^2)_4$, wherein $OR^2$ is independently. OH, a $C_1$ to $C_8$ linear or branched alkoxy or an acetate group. Examples of the first silicon-containing precursor include, but are not limited to, triethoxysilane, tri(tertiarybutoxy)silane, triemethyoxysilane, triacetoxysilane, tetra(tertiarybutoxy)silane, tetraethoxysilane, tetramethoxysilane, tetraacetoxysilane, and di(tertiary)butoxydiacetoxysilane. Further examples of the first silicon-containing precursor include: triethoxychlorosilane and trimethoxybromosilane.

The second silicon-containing precursor has one or more Si—C bond. The Si—C bond may be incorporated as an alkylsilane (Si—$CH_3$), arylsilane (Si-Ph), or any other organosilane compound having a Si—C bond. Examples of the second silicon-containing precursor include, but are not limited to, diethoxymethylsilane, dimethoxymethylsilane, ditertbutoxymethylsilane, methyltriacetatoxysilane, dimethylacetatoxysilane, dimethyldiacetoxysilane dimethyldimethoxysilane, dimethyldiethoxysilane, methyltriethoxysilane, neohexyltriethoxysilane, neopentyltrimethoxysilane, diacetoxymethylsilane, phenyldimethoxysilane, phenyldiethoxysilane, phenyltriethoxysilane, phenyltrimethoxysilane, phenylmethyidimethoxysilane, 1,3,5,7-tetramethyltetracyclosiloxane, octamethyltetracyclosiloxane, 1,1,3,3-tetramethyldisiloxane, 1-neohexyl-1,3,5,7-tetramethylcyclotetrasiloxane, hexamethyldisiloxane, 1,3-dimethyl-1-acetoxy-3-ethoxydislioxane, 1,2-diemthyl-1,2-diacetoxy-1,2-diethoxydisilane, 1,3-dimethyl-1,3-diethoxydisiloxane, 1,3-dimethyl-1,3-diacetoxydisilxane, 1,2-dimethyl,1,1,2,2-tetraacetoxydisilane, 1,2-dimethyl-1,1,2,2-tetraethoxydisilane, 1,3-dimethyl-1-acetoxy-3-ethoxydisiloxane,1,2-dimethyl-1-acetoxy-2-ethoxydisilane, methylacetoxy-t-butoxysilane, methylsilane, dimethylsilane, trimethylsilane, tetramethylsilane, hexamethyldisilane, tetramethyldisilane, and dimethyldisilane.

In an alternative embodiment, the mixture contains an asymmetric silicon-containing precursor. The asymmetric silicon-containing precursor contains Si—C and Si—O bonds and has a number ratio of Si—C bonds to Si atoms that is less than 1. The asymmetric silicon-containing precursor can be, for example, a linear or cyclic siloxane (Si—O—Si backbone), or an organosilane oligomer (Si—Si backbone). Examples of the asymmetric silicon-containing precursor include, but are not limited to, 1-methyl-1,1,2,2,2-pentamethoxydisilane, 1-methyl-1,1,2,2-tetraethoxydisilane, 1-methyl-1,1,3,3,3-pentaethoxydisiloxane, and 1-methyl-1,1,3,3-tetramethoxydisiloxane.

The following are non-limiting examples of silicon-containing precursors suitable for use with the mixture described herein. In the chemical formulas which follow and in all chemical formulas described herein, the term "independently" should be understood to denote that the subject R group is not only independently selected relative to other R groups bearing different superscripts, but is also independently selected relative to any additional species of the same R group. For example, in the formula $R^1_n(OR^2)_{4-n}Si$, when n is 2 or 3, the two or three $R^1$ groups need not be identical to each other or to $R^2$.

$R^1_n(OR^2)_{3-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane $R^1_n(OR^2)_{3-n}Si-O-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane $R^1_n(OR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraethoxydisilane $R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane $R^1_n(O(O)CR^2)_{3-n}Si-O-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane $R^1_n(O(O)CR^2)_{3-n}Si-SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane $R^1_n(O(O)CR^2)_{3-n}Si-O-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane $R^1_n(O(O)CR^2)_{3-n}Si-SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane $R^1_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane $R^1_n(OR^2)_p(O(O)CR^4)_{3-n-p}Si-O-SiR^3_m(O(O)CR^5)_q(OR^6)_{3-m-q}$ where $R^1$ and $R^3$ can be independently H, $C_1$ to $C^4$, linear or branched, saturated, singly or multiply unsaturated, cyclic, partially or fully fluorinated; $R^2$ and $R^6$ can be independently $C_1$ to $C^6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-dimethyl-1,3-diacetoxy-1,3-diethoxydisiloxane $R^1_n(OR^2)_p(O(O)CR^4)_{3-n-p}Si-SiR^3_m(O(O)CR^5)_q(OR^6)_{3-m-q}$ where $R^1$ and $R_3$ can be independently H, $C_1$ to $C^4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-dimethyl-1,2-diacetoxy-1,2-diethoxy-disilane cyclic siloxanes of the formula $(OSiR_1R_3)_x$, where $R^1$ and $R^3$ can be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

The above precursors may be added to a mixture containing one or more porogen precursors or, alternatively, the precursors may have a porogen attached thereto such as a silicon-containing porogenated precursor, and may be mixed with other molecules of these classes and/or with molecules of the same classes except where n and/or m are from 0 to 3.

Examples: TEOS, triethoxysilane, di-tertiarybutoxysilane, silane, disilane, di-tertiarybutoxydiacetoxysilane, etc.

The following are additional formulas representing certain silicon-containing precursors suitable for use with a separate porogen precursor:

(a) the formula $R^1_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

(b) the formula $R^1_n(OR^2)_p(O(O)CR^4)_{3-n-p}Si-O-SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that $n+m \geq 1$, $n+p \leq 3$ and $m+q \leq 3$;

(c) the formula $R^1_n(OR^2)_p(O(O)CR^4)_{3-n-p}Si-SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that $n+m \geq 1$, $n+p \leq 3$ and $m+q \leq 3$;

(d) the formula $R^1_n(OR^2)_p(O(O)CR^4)_{3-n-p}Si-R^7-SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that $n+m \geq 1$, $n+p \leq 3$, and $m+q \leq 3$;

(e) the formula $(R^1_n(OR^2)_p(O(O)CR^3)_{4-(n+p)}Si)_tCH_{4-t}$ where $R^1$ is independently H, or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that $n+p \leq 4$;

(f) the formula $(R^1_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that $n+p \leq 4$;

(g) cyclic siloxanes of the formula $(OSiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR_1SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8.

Although reference is made throughout the specification to siloxanes and disiloxanes as precursors, it should be understood that other siloxanes, such as trisiloxanes and other linear siloxanes of even greater length, are also within the scope of the invention.

The following are non-limiting examples of silicon-containing porogenated precursors, where the porogen material is one or more of the $R^1$, $R^3$ or $R^7$ groups contained within the same precursor rather than as a separate porogen precursor:

$R^1_n(OR^2)_{3-n}Si$ where $R^1$ can be independently H, $C_1$ to $C_{12}$, linear or branched, saturated, singly or multiply unsaturated, cyclic, partially or fully fluorinated; $R^2$ can be independently $C_1$ to $C_{12}$, linear or branched, saturated, singly or multiply unsaturated, cyclic, aromatic, partially or fully fluorinated, n is 1 to 3.

Example: diethoxy-neo-hexylsilane $R^1_n(OR^2)_{3-n}Si-O-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,3-diethoxy-1-neo-hexyldisiloxane $R^1_n(OR^2)_{3-n}Si-SiR^3_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,2-diethoxy-1-neo-hexyldisilane $R^1{}_n(OR^2)_{3-n}Si$—$R^7$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, $R^7$ is $C_1$ to $C_{12}$, linear or branched, saturated, singly or multiply unsaturated, cyclic, partially or fully fluorinated, and bridges the two Si atoms, n is 1 to 3 and m is 1 to 3.

Example: 1,4-bis(dimethoxysilyl)cyclohexane $R^1{}_n(OR^2)_{3-n}Si$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated, $R^2$ and $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1,2-diethoxy-1-neo-hexyldisilane $R^1{}_n(O(O)CR^2)_{4-n}Si$ where $R^1$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, n is 1 to 3.

Example: diacetoxy-neo-hexylsilane $R^1{}_n(O(O)CR^2)_{3-n}Si$—O—$SiR^3{}_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.

Example: 1,3-diacetoxy-1-neo-hexyldisiloxane $R^1{}_n(O(O)CR^2)_{3-n}Si$—$SiR^3{}_m(O(O)CR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ and $R^4$ can be independently H, $C_1$ to $C_{12}$, linear or branched, saturated, singly or multiply unsaturated, cyclic, aromatic, partially or fully fluorinated, n is 1 to 3 and m is 1 to 3.

Example: 1,2-diacetoxy-1-neo-hexyldisilane $R^1{}_n(O(O)CR^2)_{3-n}Si$—O—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1-acetoxy-3,3-di-t-butoxy-1-neohexyldisiloxane $R^1{}_n(O(O)CR^2)_{3-n}Si$—$SiR^3{}_m(OR^4)_{3-m}$ where $R^1$ and $R^3$ can be independently H, $C_1$ to $C_{12}$, linear or branched, saturated, singly or multiply unsaturated, cyclic, partially or fully fluorinated; $R^2$ can be independently H, $C_1$ to $C_{12}$, linear or branched, saturated, singly or multiply unsaturated, cyclic, aromatic, partially or fully fluorinated, $R^4$ can be independently $C_1$ to $C_{12}$, linear or branched, saturated, singly or multiply unsaturated, cyclic, aromatic, partially or fully fluorinated, n is 1 to 3 and m is 1 to 3.

Example: 1-acetoxy-2,2-di-t-butoxy-1-neohexyldisilane $R^1{}_n(OR^2)_p(O(O)CR^3)_{4-(n+p)}Si$ where $R^1$ can be independently H, $C_1$ to $C_{12}$, linear or branched, saturated, singly or multiply unsaturated, cyclic, partially or fully fluorinated, $R^2$ can be independently $C_1$ to $C_{12}$, linear or branched, saturated, singly or multiply unsaturated, cyclic, aromatic, partially or fully fluorinated; $R^3$ can be independently H, $C_1$ to $C_{12}$, linear or branched, saturated, singly or multiply unsaturated, cyclic, aromatic, partially or fully fluorinated, and n is 1 to 3 and p is 1 to 3.

Example: acetoxy-t-butoxy-neo-hexylsilane $R^1{}_n(OR^2)_p(O(O)CR^4)_{3-n-p}Si$—O—$SiR^3{}_m(O(O)CR^5)_q(OR^6)_{3-m}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-diacetoxy-1,3-di-t-butoxy-1-neohexyldisiloxane $R^1{}_n(OR^2)_p(O(O)CR^4)_{3-n-p}Si$—$SiR^3{}_m(O(O)CR^5)_q(OR^6)_{3-m-q}$ where $R^1$ and $R^3$ can be independently H, $C_1$ to $C_{12}$, linear or branched, saturated, singly or multiply unsaturated, cyclic, partially or fully fluorinated; $R^2$, $R^6$ can be independently $C_1$ to $C_{12}$, linear or branched, saturated, singly or multiply unsaturated, cyclic, aromatic, partially or fully fluorinated, $R^4$, $R^5$ can be independently H, $C_1$ to $C_{12}$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-diacetoxy-1,2-di-t-butoxy-1-neohexyldisilane cyclic siloxanes of the formula $(OSiR_1R_3)_x$, where $R^1$ and $R^3$ can be independently H, $C_1$ to $C_{12}$, linear or branched, saturated, singly or multiply unsaturated, cyclic, partially or fully fluorinated, and x may be any integer from 2 to 8.

Example: such as 1-neohexyl-1,3,5,7-tetramethylcyclotetrasiloxane

The precursor mixture may optionally contain a distinct porogen precursor in addition to, or in place of, a silicon-containing porogenated precursor. The porogen precursor may be added to the mixture, for example, to provide a porous OSG film having a dielectric constant of 3.0 or below. The resulting as-deposited film may have an OSG phase along with an organic polymer phase that can be removed, if desired, by a post-deposition treatment to produce a porous OSG film. The amount of porogen precursor deposited in the film may be related to both the ratio of silicon-containing precursor to porogen precursor and to the deposition conditions. The porogen precursor can be removed from the film after deposition, for example, by a thermal anneal thereby leaving behind a porous OSG network with a dielectric constant of 3.0 or below. In certain embodiments, an anneal step is performed at a temperature of 425° C. In these embodiments, the deposition temperature of the mixture containing the porogen precursor should be sufficiently below the anneal temperature in order to incorporate the porogen precursor into the film. In these films, the deposition temperature should be about 300° C. or below or about 280° C. or below. The amount of porogen precursor that is added to the mixture may range from 5 to 95% by volume of the total volume of the mixture. An example of a mixture that contains the first and second silicon-containing precursors and the porogen precursor is triethoxysilane, diethoxymethylsilane, and alpha-terpinine. An example of a mixture that contains an asymmetric silicon-containing precursor and porogen precursor is 1-methyl-1,1,3,3,3-pentaethoxydisiloxane and alpha-terpinine.

The following are non-limiting examples of porogen precursors that can be added into the mixture: cyclic hydrocarbons of the general formula $C_nH_{2n}$ where n is a number ranging from 4 to 14, where the number of carbons in the cyclic structure is from 4 and 10, and where there can be a plurality of simple or branched hydrocarbons substituted onto the cyclic structure (examples include: cyclohexane, trimethylcyclohexane, 1-methyl-4(1-methylethyl)cyclohexane, cyclooctane, methylcyclooctane, etc.); linear or branched, saturated, singly or multiply unsaturated hydrocarbons of the general formula $C_nH_{(2n+2)+2y}$ where n is a number ranging from 2 to 20 and where y is from 0 to n (examples include: ethylene, propylene, acetylene, neohexane, etc.); singly or multiply unsaturated cyclic hydrocarbons of the general formula $C_nH_{2n-2x}$ where x is the number of unsaturated sites in the molecule, n is a number ranging from 4 to 14, where the number of carbons in the cyclic structure ranges from 4 to 10, and where there can be a plurality of simple or branched hydrocarbons substituted onto the cyclic structure and where the unsaturation can be located inside endocyclic or on one of the hydrocarbon substituents to the cyclic structure (examples include cyclohexene, vinylcyclohexane, dimethylcyclohexene, t-butylcyclohexene, alpha-terpinene, limonene, pinene, 1,5-dimethyl-1,5-cyclooctadiene, vinyl-cyclohexene, etc.); bicyclic hydrocarbons of the general formula $C_nH_{2n-2}$ where n is a number ranging from 4 to 14, where the number of carbons in the bicyclic structure is from 4 to 12, and where there can be a plurality of simple or branched hydrocarbons substituted onto the cyclic structure (examples include, norbornane, spiro-nonane, decahydronaphthalene, etc.); multiply unsaturated bicyclic hydrocarbons of the general formula $C_nH_{2n-(2+2)}$ where x is the number of unsaturated sites in the molecule, n is a number ranging from 4 to 14, where the number of carbons in the bicyclic structure is from 4 to 12, where there can be a plurality of simple or branched hydrocarbons substituted onto the cyclic structure, and where the unsaturation can be located inside endocyclic or on one of the hydrocarbon substituents to the cyclic structure (examples include camphene, norbornene, norbornadiene, etc.); and tricyclic hydrocarbons of the general formula $C_nH_{2n-4}$ where n is a number ranging from 4 to 14, where the number of carbons in the tricyclic structure is from 4 to 12, and where there can be a plurality of simple or branched hydrocarbons substituted onto the cyclic structure (examples include adamantine). In addition to the aforementioned porogen precursors, any compound that can be deposited under deposition conditions and form pores or voids upon treatment with one or more energy sources can be used in the mixture described herein. Examples of other porogen precursors include labile organic groups, solvents, decomposable polymers, surfactants, dendrimers, hyper-branched polymers, polyoxyalkylene compounds, and combinations thereof.

In certain embodiments, an oxidant may be introduced into the reaction chamber during at least a portion of the deposition. Examples of suitable oxidants include $O_2$, $N_2O$, NO, $NO_2$, $H_2O_2$, or ozone.

In some embodiments, additive materials can be charged into the reaction chamber and/or vessel the prior to, during and/or after deposition. These additive materials may be employed, for example, as a carrier gas for lesser volatile precursors and/or which can promote the curing of the as-deposited materials and provide a more stable final film. Examples of additive materials include inert gases, such as, but not limited to, He, Ar, $N_2$, Kr, Xe, etc., or gaseous or liquid organic substances such as, but not limited to, $NH_3$, $H_2$, $CO_2$, or CO.

The mixture can further comprise at least one pressurizable vessel fitted with the proper valves and fittings to allow the delivery of one or more precursors or chemical reagents to the process reactor. In certain embodiments, the contents of the vessel(s) can be premixed. Alternatively, the precursors can be maintained in separate vessels or in a single vessel having separation means for maintaining the precursors separate during storage. Such vessels can also have means for mixing the precursors when desired. The precursors can be pre-mixed and then delivered to the reaction chamber, or alternatively, delivered separately wherein the mixture is formed in-situ within the reaction chamber and/or on the deposited film itself.

The organosilicate films are deposited onto at least a portion of a substrate from the mixture of precursors using a variety of different methods. These methods may be used by themselves or in combination. Some examples of processes that may be used to form the organosilicate film include the following: thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, photo initiated chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the organosilicate film of the present invention. In certain embodiments, the deposition is conducted at a temperature ranging from 100 to 425° C., or from 200 to 425°, or from 200 to 300°. Although the chemical reagents used herein may be sometimes described as "gaseous", it is understood that the chemical reagents may be delivered directly as a gas to the reactor, delivered as a vaporized liquid, a sublimed solid and/or transported by an inert carrier gas into the reactor.

In certain embodiments of the present invention, the organosilicate film is formed through a plasma-enhanced chemical vapor deposition process. Briefly in a PECVD process, chemical reagents are flowed into a reaction chamber such as a vacuum chamber and plasma energy energizes the chemical reagents thereby forming a film on at least a portion of the substrate. In these embodiments, the organosilicate film can be formed by the co-deposition, or alternatively the sequential deposition, of a gaseous mixture comprising at least one silicon-containing precursor, such as, for example, an organosilicon material, that forms the structure-former phase with at least one plasma-polymerizable porogen precursor that forms the pore-former phase. In certain embodiments, the plasma energy applied to the reagents may range from 0.02 to 7 watts/cm², or from 0.3 to 3 watts/cm². Flow rates for each of the reagents may ranges from 10 to 5000 sccm. Pressure values in the vacuum chamber during deposition for a PECVD process of the present invention may range from 0.01 to 600 torr, or from 1 to 10 torr. In certain embodiments, the deposition is conducted at a temperature ranging from 100 to 425° C., or from 200 to 425°, or from 200 to 300°. It is understood however that process parameters such as plasma energy, flow rate, and pressure may vary depending upon numerous factors such as the surface area of the substrate, the structure-former and pore-former phases to be formed, the equipment used in the PECVD process, etc.

Energy is applied to the mixture of precursors to induce reaction and to form the OSG film on the substrate. Such energy can be provided by, e.g., thermal, plasma, pulsed plasma, helicon plasma, high density plasma, inductively coupled plasma, and remote plasma methods. In certain embodiments, a secondary RF frequency source can be used to modify the plasma characteristics at the substrate surface.

In one particular embodiment, the film is formed by plasma enhanced chemical vapor deposition. In these embodiments, the PECVD is conducted using a capacitively coupled plasma at a frequency of 13.56 MHz. The plasma power may range from 0.02 to 7 watts/cm$^2$, or 0.3 to 3 watts/cm$^2$, based upon a surface area of the substrate. It may be advantageous to employ a carrier gas, which possesses a low ionization energy to lower the electron temperature in the plasma, which in turn will cause less fragmentation of the silicon-containing precursor(s) within the mixture. Examples of low ionization energy carrier gases include $CO_2$, $NH_3$, CO, $CH_4$, Ar, Xe, Kr or any of the other additive materials disclosed herein.

The flow rate for each of the reagents within the mixture or the precursor mixture itself may range from 10 to 5000 sccm, or from 30 to 1000 sccm, per single 200 mm wafer. The individual rates are selected so as to provide the desired amounts of structure-former and pore-former in the film. The actual flow rates needed may depend upon wafer size and chamber configuration, and are not limited to 200 mm wafers or single wafer chambers.

In certain embodiments, the OSG film is deposited at a deposition rate of at least 50 nm/min.

In certain embodiments, the pressure in the vacuum chamber during deposition may range from 0.01 to 600 torr or from 1 to 15 torr.

The film may be deposited to a thickness of from 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity. In certain embodiments wherein a porogen precursor is added into the mixture, the porogen precursor is removed from the preliminary (or as-deposited) film by a curing step, which can comprise thermal annealing, chemical treatment, in-situ or remote plasma treating, photocuring and/or microwaving. Other in-situ or post-deposition treatments may be used to enhance material properties such as hardness, stability (to shrinkage, to air exposure, to etching, to wet etching, etc.), integrability, uniformity and adhesion. Such treatments can be applied to the film prior to, during and/or after porogen removal using the same or different means used for porogen removal. Thus, the term "treating" as used herein denotes post-treating the film with energy (e.g., thermal, plasma, photon, electron, microwave, etc.) or chemicals to remove porogen, stabilize the film and/or to enhance material properties.

The conditions under which post-treating are conducted can vary greatly. For example, post-treating can be conducted under high pressure or under a vacuum ambient.

In certain embodiments, the OSG film is subjected to an annealing step. In these embodiments, the annealing step is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure may range from about 1 Torr to about 1000 Torr, or atmospheric pressure. However, a vacuum ambient is also possible for thermal annealing as well as any other post-treating means. The temperature may range from 200 to 500° C. The temperature ramp rate may range from 0.1 to 100 deg ° C./min. The temperature may range from ambient to 500° C. The pressure may range from 10 mtorr to atmospheric pressure. The total curing time may range from 0.01 min to 12 hours.

In certain embodiments, the OSG film is subjected to one or more chemical treatments. In these embodiments, the chemical treatment of the OSG film is conducted under the following conditions. The use of fluorinating (HF, $SiF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

In certain embodiments, the OSG film is subjected to a post-treatment using a supercritical fluid. In these embodiments, the supercritical fluid post-treatment for an organosilicate film is conducted under the following conditions. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The chemicals can also include surfactants. The temperature may range from ambient to 500° C. The pressure may range from 10 mtorr to atmospheric pressure. The total curing time is may range from 0.01 min to 12 hours.

In certain embodiments, the OSG film is subjected to a plasma treatment for selective removal of labile groups or porogen precursors and possible chemical modification of the OSG film. In these embodiments, the plasma treating is conducted under the following conditions. The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), reducing (e.g., dilute or concentrated hydrogen, hydrocarbons (saturated, unsaturated, linear or branched, aromatics), etc.), or mixtures thereof (e.g., $CF_4/H_2$, $CF_4/H_2/N_2$). The plasma power may range from 0 to 5000 W. The temperature may range from ambient to 500° C. The pressure may range from 10 mtorr to atmospheric pressure. The total curing time is may range from 0.01 min to 12 hours.

In certain embodiments, the OSG film is subjected to photocuring. In these embodiments, photocuring is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The power may range from 0 to 5000 W. The wavelength can be IR, visible, UV or deep UV (wavelengths<200 nm). The temperature may range from ambient to 500° C. The pressure may range from 10 mtorr to atmospheric pressure. The total curing time is may range from 0.01 min to 12 hours.

In certain embodiments, the OSG film is subjected to microwave post-treatment. In these embodiments, microwave post-treatment is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature may range from ambient to 500° C. The power and wavelengths are varied and tunable to specific bonds. The total curing time may range from 0.01 min to 12 hours.

In certain embodiments, the OSG film is subjected to electron beam post-treatment. The use of electron beam treatment may provide for porogen removal and enhancement of film mechanical properties through bond-formation processes in matrix. In these embodiments, electron beam post-treatment is conducted under the following conditions. The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature may range from ambient to 500° C. The electron density and energy can be varied and tunable to specific bonds. The total curing time may range from 0.001 min to 12 hours, and may be continuous or pulsed. Examples of certain electron beam treatments is provided in the following: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1.

In certain embodiments, the OSG films described herein may also contain fluorine. In these embodiments, the amount of fluorine contained therein may range from 0.5 to 7 atomic %. Examples of fluorine-containing precursors that may be included in the mixture described herein include $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof. Further examples of fluorine-containing precursors include the above mentioned alkylsilanes, alkoxysilanes, linear and cyclic organosiloxanes, linear and cyclic organosilane oligomers, cyclic or bridged organosilanes, and organosilanes with fluorine-containing side groups. Of the foregoing, suitable fluorine-providing precursors include, but are not limited to, fluorotrimethylsilane, difluorodimethylsilane methyltrifluorosilane, fluorotriethoxysilane, 1,2-difluoro-1,1,2,2,-tetramethyldisilane, or difluorodimethoxysilane.

The OSG films are thermally stable and exhibit good chemical resistance. In particular, certain OSG films after anneal have an average weight loss of less than 1.0 wt %/hr isothermal at 425° C. under $N_2$. In certain embodiments, the films may exhibit an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, WN, or W(C)N. The films are capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an intermetal dielectric layer, a capping layer, a chemical-mechanical planarization or etch stop layer, a barrier layer or an adhesion layer in an integrated circuit.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits.

The invention will be illustrated in more detail with reference to the following Examples, but it should be understood that the present invention is not deemed to be limited thereto.

EXAMPLES

Exemplary OSG films were formed via a plasma enhanced CVD process using an Applied Materials Precision-5000 system in a 200 mm DxZ vacuum chamber that was fitted with an Advance Energy 200 RF generator from a variety of different chemical precursors and process conditions. Unless otherwise stated, the films were deposited onto 8' high, low resistivity (R<0.02 ohm-cm) silicon wafers. The CVD process generally involved the following basic steps: initial set-up and stabilization of gas flows, deposition, and purge/evacuation of chamber prior to wafer removal. The thickness and refractive index (RI) of each film were measured on an SCI Filmtek 2000 Reflectometer. The dielectric constant (k) of each film was determined using the mercury probe capacitance technique on low resistivity p-type wafers (R<0.02 ohm-cm). Mechanical properties such as hardness (H) were determined by nanoindentation using a MTS Nano Indenter. Transmission FTIR spectra were collected on a Thermo-Nicolet 750 Spectrophotometer at 4 $cm^{-1}$ resolution for samples deposited on high resistivity substrates (typically R>10 ohm-cm).

Where applicable, thermal post-deposition treatment or annealing was performed in an Applied Test Systems, Inc. series 3210 tube furnace fitted with 4" diameter purged quartz tube with a nitrogen flow ranging from 2 to 4 slpm. The ramp rate was 13° C. per minute for a temperature range or from 25 to 425° C. Samples were held isothermal at 425° C. for 4 hours. The films were cooled to below 100° C. before removal from the furnace.

Comparison of Precursor Mixtures Containing DEMS and DEMS/TES

Figure 4:
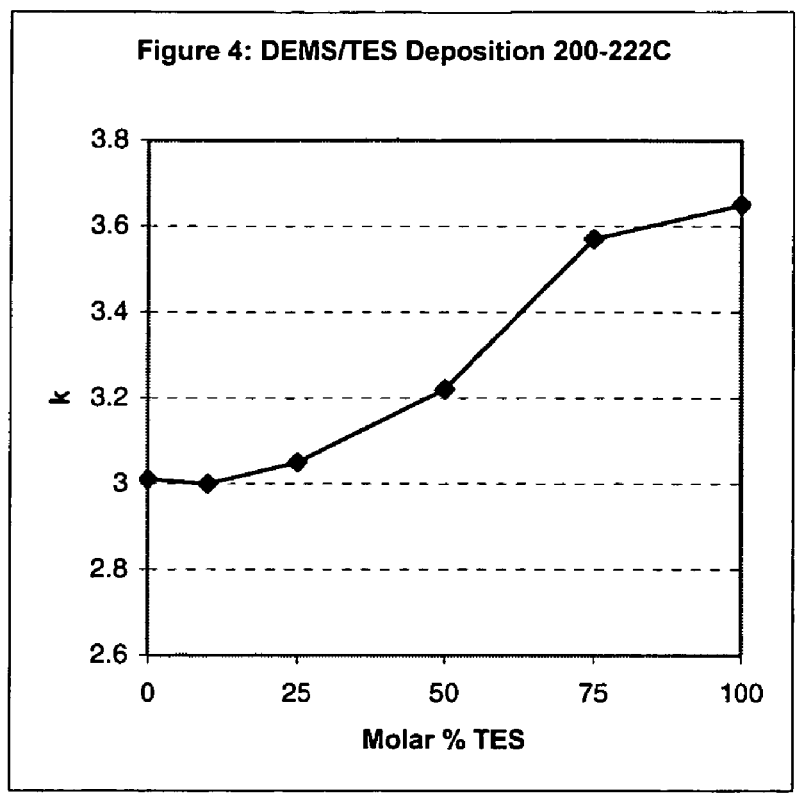
FIG. 4 shows the relationship between the molar % of TES and the dielectric constant from as-deposited films prepared by the deposition of a mixture containing diethoxymethylsilane and triethoxysilane at deposition temperatures ranging from 200° C. to 220° C.

OSG films were deposited via PECVD from mixtures containing varying amounts of the first silicon-containing precursor triethoxysilane (TES) and the second silicon-containing precursor DEMS. The DEMS and TES precursors were delivered to the DxZ chamber of an Applied Materials P5000 using two separate liquid injection lines. The PECVD deposition was conducted under the following conditions: injector temps 100° C., wall temp 65° C., spacing 300-400 mm, pressure 6-9 torr, plasma power 300-600 W. In certain examples, PA signifies a post-deposition anneal was conducted under $N_2$ at 425° C. for 4 hours. XPS data was collected from each film and the results provided atomic % after sputter and excluding hydrogen. FIG. 4 provides a graphical representation of the relationship between the % of TES and the dielectric constant from films prepared by the deposition of a mixture containing varying amounts of the first silicon-containing precursor triethoxysilane and the second silicon-containing precursor diethoxymethylsilane at deposition temperatures ranging from 20° C. to 220° C., or Comp. Ex. 2, Ex. 1, Ex. 2, Ex. 4a, Ex. 5, and Comp. Ex. 4.

TABLE I

DEMS/TES Depositions

| Run | % TES (molar) | % DEMS (molar) | Chuck Temp (° C.) | H (GPa) | RI | K | XPS | C/Si Ratio |
|---|---|---|---|---|---|---|---|---|
| Comp. Ex. 1a | 0 | 100 | 150 | 0.31 | 1.449 | 3.04 | C 31 O 39 Si 30 | 1.03 |
| Comp. Ex. 1b (PA) | 0 | 100 | 150 | 0.32 | 1.423 | 2.81 | C 26 O 41 Si 33 | 0.79 |
| Comp. Ex. 2 | 0 | 100 | 390 | 3.0 | 1.405 | 3.0 | C 14.4 O 50.1 Si 35.5 | 0.41 |
| Comp. Ex. 3 | 0 | 100 | 200 | — | — | 2.99 | — | — |
| Comp. Ex. 4 | 100 | 0 | 203 | — | 1.414 | 3.65 | — | — |
| Ex. 1 | 10 | 90 | 200 | — | 1.430 | 3.00 | — | — |
| Ex. 2 | 25 | 75 | 222 | — | 1.420 | 3.05 | — | — |
| Ex. 3 | 50 | 50 | 200 | — | 1.403 | 3.28 | — | — |
| Ex. 4a | 50 | 50 | 218 | 1.07 | 1.423 | 3.22 | C 16.5 O 47.6 Si 35.9 | 0.46 |
| Ex. 4b (PA) | 50 | 50 | 218 | 1.89 | — | 3.40 | C 10.6 O 51.4 Si 38.0 | 0.28 |
| Ex. 5 | 75 | 25 | 207 | — | 1.422 | 3.57 | — | — |
| Ex. 6 | 50 | 50 | 200 | — | 1.403 | 3.28 | — | — |
| Ex. 7 | 25 | 75 | 260 | 1.36 | 1.424 | 3.05 | C 19.6 O 43.9 Si 36.5 | 0.46 |
| Ex. 8a | 50 | 50 | 260 | 1.76 | 1.417 | 3.17 | C 15.1 O 47.5 Si 37.4 | 0.40 |
| Ex. 8b (PA) | 50 | 50 | 260 | 2.06 | — | 3.13 | C 12.9 O 49.1 Si 38.0 | 0.34 |
| Ex. 9 | 75 | 25 | 260 | — | 1.420 | 3.47 | — | — |
| Ex. 10 | 25 | 75 | 425 | — | 1.441 | 3.29 | — | — |
| Ex. 11a | 50 | 50 | 425 | 3.49 | 1.432 | 3.42 | C 9.6 O 51.5 Si 38.9 | 0.25 |
| Ex. 11b (PA) | 50 | 50 | 425 | 4.23 | — | 3.43 | C 8.1 O 53.2 Si 38.4 | 0.21 |

The data provided in Table I illustrate a variety of different relationships. First, the dielectric constant increased as the % of the first silicon-containing precursor or TES is increased which may be due, in part, to the decrease in organic substituents in the film. Further, FIG. 4 illustrates that substituting 50% of the Si atoms in the mixture with methyl groups results in a 13% decrease in the dielectric constant whereas substituting all of the Si atoms with a methyl group (i.e., 100% DEMS) results in a further decrease of only 6%. This shows that the benefit to dielectric constant of adding organic groups to a silica-based network diminishes after about 50-75% of the Si atoms are substituted with the organic groups. Second, the carbon content for the 50% TES depositions (XPS) is consistently below 20% atomic.

Figure 5:
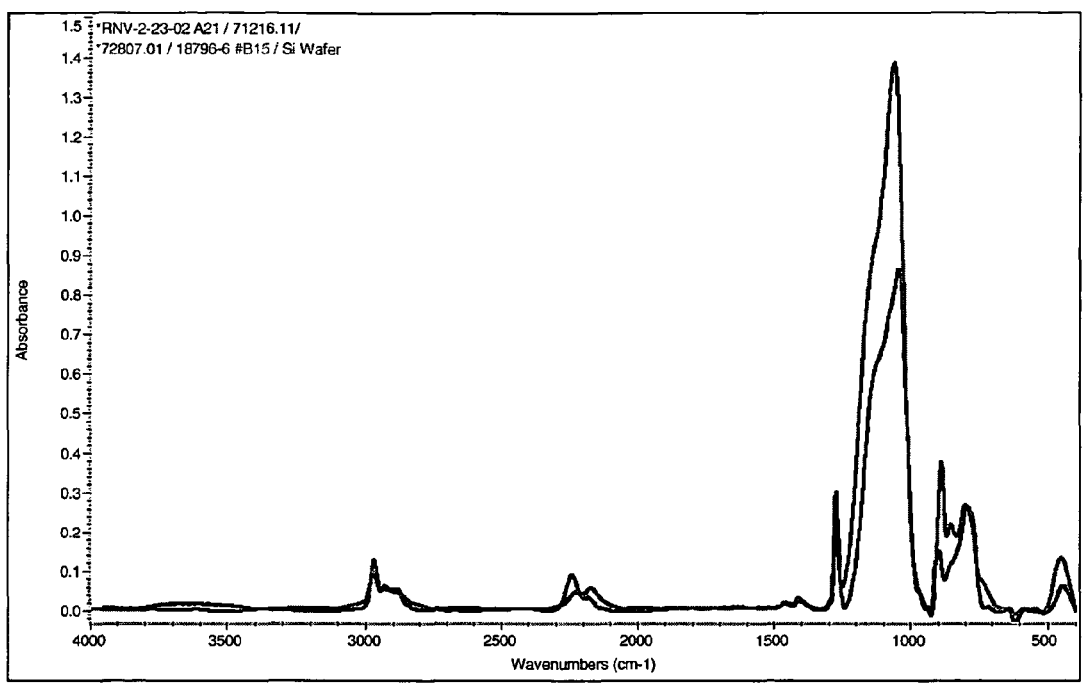
FIG. 5 shows the infrared spectrum of a comparative film deposited from diethoxymethylsilane at a deposition temperature of 150° C., and a spectrum of a film deposited from a mixture containing diethoxymethylsilane and triethoxysilane at a deposition temperature of 210° C., the absorbance of both spectra are normalized for the film thickness.

FIG. 5 provides the FTIR of samples Comp. Ex. 1a and Ex. 3, normalized to the Si—C stretch at 1275 cm$^{-1}$. The intensity of the Si—O band (1100 cm$^{-1}$) of the Ex. 3 film, which contains 50% TES, is almost twice as intense as the Si—O band for Comp. Ex. 1a, which contains no TES, thereby signifying the Ex. 3 film may have more Si—O cross-linking and a corresponding lower methyl content.

Comparison of Precursor Mixtures Containing DEMS and ATRP and DEMS/TES and ATRP

Porous OSG films were prepared from mixtures containing the second silicon-containing precursor DEMS and the porogen precursor alpha-terpinene (ATRP) and mixtures containing the first and second silicon-containing precursor, or TES and DEMS, and ATRP. For the data reflected in Table II, all of the examples were subjected to a post-anneal treatment at 425° C. for 4 hours under a nitrogen atmosphere. Table II provides the processing conditions for the deposition along with the dielectric constant, hardness, atomic weight percent of carbon, and ratio of C/Si in the resultant film. Referring to Table II, the Comp. Ex. 5 and 6 films did not contain TES and had a carbon content much higher than Ex. 12 and 13 films. Further, the hardness of the film increased as the amount of TES was increased.

TABLE II

TES/DEMS/ATRP Depositions:

| | Ex. 12 | Comp Ex 5 | Ex. 13 | Comp Ex 6 |
|---|---|---|---|---|
| K | 2.54 | 2.38 | 2.34 | 2.18 |
| H, GPa | 1.33 | 0.31 | 0.57 | 0.25 |
| Chuck Temp, ° C. | 265 | 250 | 265 | 250 |
| Plasma power, W | 650 | 600 | 650 | 600 |
| Spacing | 300 | 350 | 300 | 350 |
| Pressure, torr | 12 | 8 | 10 | 8 |
| Carrier, $CO_2$ (sccm) | 325 | 220 | 225 | 220 |
| TES, mg/min | 150 | 0 | 100 | 0 |
| TES, sccm | 22 | 0 | 18 | 0 |
| DEMS, mg/min | 150 | 158 | 100 | 105 |
| DEMS, sccm | 22 | 26 | 18 | 18 |
| ATRP, mg/min | 1000 | 367 | 800 | 420 |
| ATRP, sccm | 210 | 62 | 168 | 70 |
| Wt % TES | 15 | 0 | 10 | 0 |
| Wt % DEMS | 15 | 30 | 10 | 20 |
| Wt % ATRP | 70 | 70 | 80 | 80 |
| % C | 16 | 25 | 19 | 26 |
| % Si | 36 | 32 | 36 | 31 |
| % O | 48 | 43 | 45 | 43 |
| C/Si Ratio in the final film | 0.45 | 0.77 | 0.53 | 0.83 |

Figure 6:
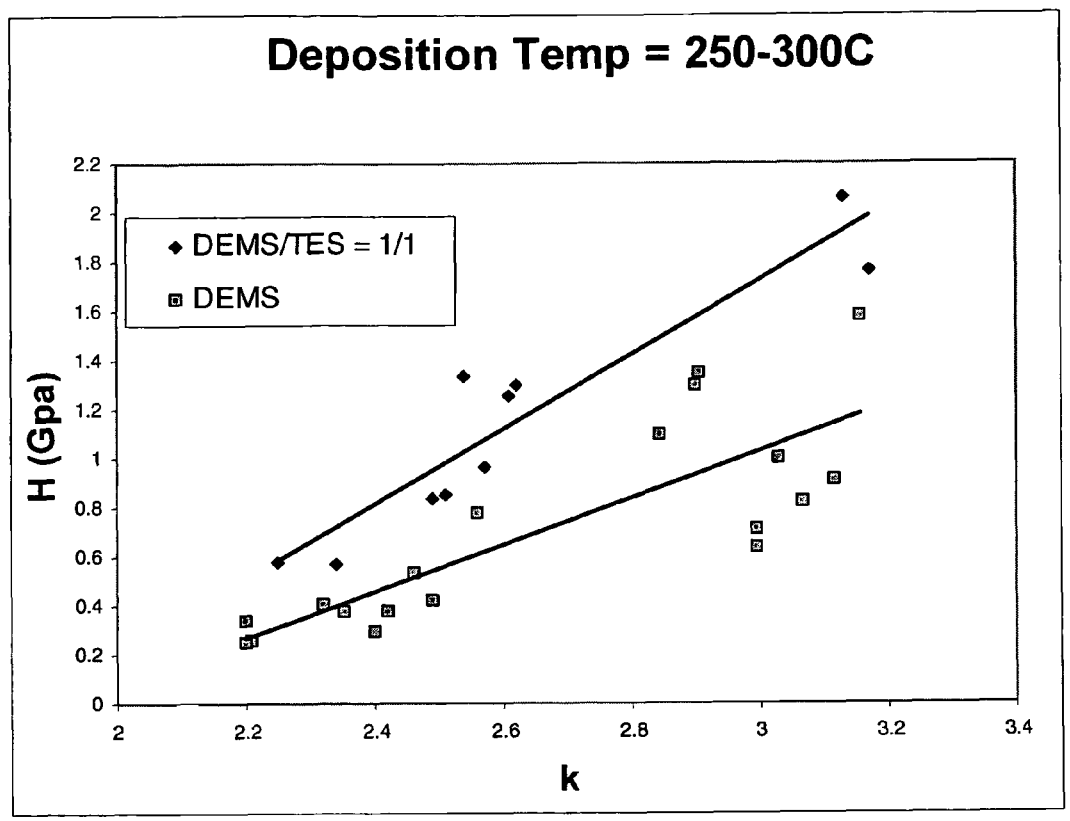
FIG. 6 shows hardness and dielectric constant data obtained from films deposited from diethoxymethylsilane or a mixture containing diethoxymethylsilane and triethoxysilane at various deposition conditions and temperatures that range between 250° C. and 300° C. Films that have dielectric constants below 2.8 were co-deposited with the porogen precursor alpha-terpinene and annealed after deposition.

FIG. 6 shows a plot of dielectric constant (k) vs. hardness (H) for a variety of comparative example DEMS films and films deposited from a mixture comprising the first silicon-containing precursor TES and the second silicon-containing precursor DEMS deposited at various plasma powers, spacing, carrier gas, and pressures. The data points represent the films that provided the highest hardness values at certain dielectric constants, regardless of the deposition conditions, with the caveat that the temperature had to be between 250-300° C. Table III provides the compositions for these films. Referring to Table III, some of the samples had the porogen precursor ATRP added with the exception of Ex. 14 and Comp. Ex. 14-21, the films were subjected to a post-treatment anneal at 425° C. for 4 hours under a nitrogen atmosphere. FIG. 6 illustrates that the depositions in which TES was added have higher hardness values for the films that had the same dielectric constants.

TABLE III

| Example | TES (molar %) | DEMS (molar %) | ATRP (molar %) | k | H (GPa) |
|---|---|---|---|---|---|
| Comp. Ex. 7 | 0 | 20 | 80 | 2.2 | 0.37 |
| Comp. Ex. 8 | 0 | 34 | 66 | 2.21 | 0.26 |
| Comp. Ex. 9 | 0 | 30 | 70 | 2.42 | 0.38 |
| Comp. Ex. 10 | 0 | 30 | 70 | 2.4 | 0.3 |
| Comp. Ex. 11 | 0 | 30 | 70 | 2.35 | 0.38 |
| Comp. Ex. 12 | 0 | 21 | 79 | 2.32 | 0.41 |
| Comp. Ex. 13 | 0 | 21 | 79 | 2.56 | 0.78 |
| Comp. Ex. 14 | 0 | 100 | 0 | 2.9 | 1.3 |
| Comp. Ex. 15 | 0 | 100 | 0 | 2.84 | 1.1 |
| Comp. Ex. 16 | 0 | 100 | 0 | 3.12 | 0.91 |
| Comp. Ex. 17 | 0 | 100 | 0 | 2.99 | 0.64 |
| Comp. Ex. 18 | 0 | 100 | 0 | 3.07 | 0.82 |
| Comp. Ex. 19 | 0 | 100 | 0 | 2.99 | 0.71 |
| Comp. Ex. 20 | 0 | 100 | 0 | 3.03 | 1 |
| Comp. Ex. 21 | 0 | 100 | 0 | 3.16 | 1.58 |
| Ex. 14 | 50 | 50 | 0 | 3.17 | 1.76 |
| Ex. 15 | 50 | 50 | 0 | 3.13 | 2.06 |
| Ex. 16 | 16.5 | 16.5 | 67 | 2.57 | 0.96 |
| Ex. 17 | 13 | 13 | 74 | 2.54 | 1.33 |
| Ex. 18 | 16.5 | 16.5 | 67 | 2.61 | 1.25 |
| Ex. 19 | 11 | 11 | 78 | 2.34 | 0.57 |
| Ex. 20 | 13 | 13 | 74 | 2.51 | 0.85 |
| Ex. 21 | 13 | 13 | 74 | 2.25 | 0.58 |
| Ex. 22 | 13 | 13 | 74 | 2.49 | 0.84 |
| Ex. 23 | 13 | 13 | 74 | 2.62 | 1.3 |

We claim:

1. A process for making an organosilicate glass film having a dielectric constant of 4.0 or less, the process comprising:
   providing a silicon-containing mixture that is one selected from the following: a mixture (i) comprising a first silicon-containing precursor that comprises from 3 to 4 Si—O bonds per Si atom, from 0 to 1 of a bond selected from the group consisting of Si—H, Si—Br, or Si—Cl bonds per Si atom, and no Si—C bonds, and a second silicon-containing precursor that comprises at least one Si—C bond per Si atom; and a mixture (ii) comprising an asymmetric silicon-containing precursor having a number ratio of Si—C bonds to Si atoms that is less than 1;
   adding a hydrocarbon porogen to the silicon-containing mixture, wherein the hydrocarbon porogen is plasma-polymerizable and is selected from the group consisting of:
   (a) at least one cyclic hydrocarbon having a cyclic structure and the formula $C_nH_{2n}$, where n is a number ranging from 4 to 14, a number of carbons in the cyclic structure ranging from 4 to 10, and the at least one cyclic hydrocarbon optionally contains a plurality of simple or branched hydrocarbons substituted onto the cyclic structure;
   (b) at least one linear or branched, saturated, singly or multiply unsaturated hydrocarbon of the general formula $C_nH_{(2n+2)+2y}$ where n is a number ranging from 2 to 20 and where y is a number ranging from 0 to n;
   (c) at least one singly or multiply unsaturated cyclic hydrocarbon having a cyclic structure and the formula $C_nH_{2n-2x}$, where x is a number of unsaturated sites, n is a number ranging from 4 to 14, a number of carbons in the cyclic structure ranging from 4 to 10, and the at least one singly or multiply unsaturated cyclic hydrocarbon optionally contains a plurality of simple or branched hydrocarbons substituents substituted onto the cyclic structure, and contains endocyclic unsaturation or unsaturation on one of the hydrocarbon substituents;
   (d) at least one bicyclic hydrocarbon having a bicyclic structure and the formula $C_nH_{2n-2}$, where n is a number ranging from 4 to 14, a number of carbons in the bicyclic structure ranging from 4 to 12, and the at least one bicyclic hydrocarbon optionally contains a plurality of simple or branched hydrocarbons substituted onto the bicyclic structure;
   (e) at least one multiply unsaturated bicyclic hydrocarbon having a bicyclic structure and the formula $C_nH_{2n-(2+2x)}$, where x is a number of unsaturated sites, n is a number ranging from 4 to 14, a number of carbons in the bicyclic structure ranging from 4 to 12, and the at least one multiply unsaturated bicyclic hydrocarbon optionally contains a plurality of simple or branched hydrocarbons substituents substituted onto the bicyclic structure, and contains endocyclic unsaturation or unsaturation on one of the hydrocarbon substituents; and
   (f) at least one tricyclic hydrocarbon having a tricyclic structure and the formula $C_nH_{2n-4}$, where n is a number ranging from 4 to 14, a number of carbons in the tricyclic structure ranging from 4 to 12, and the at least one tricyclic hydrocarbon optionally contains a plurality of simple or branched hydrocarbons substituted onto the cyclic structure;
   introducing the silicon-containing mixture and the hydrocarbon porogen into a reaction chamber having a substrate contained therein; and
   applying plasma energy to the silicon-containing mixture and the hydrocarbon porogen in the reaction chamber to induce a polymerization reaction and deposit the organosilicate glass film on the substrate by chemical vapor deposition, wherein the organosilicate glass film comprises a structure-former phase formed by the polymerization reaction of the silicon-containing mixture and a pore-former phase formed by the polymerization reaction of the hydrocarbon porogen.

2. The process of claim 1 further comprising the step of treating the organosilicate glass film with at least one post-treating agent selected from the group consisting of thermal energy, plasma energy, photon energy, electron energy, microwave energy, and chemical treatments.

3. The process of claim 2, wherein the treating step is conducted during at least a portion of the applying step.

4. The process of claim 2, wherein the treating step is conducted after the completion of the applying step.

5. The process of claim 1 wherein the hydrocarbon porogen is at least one selected from the group consisting of: alpha-terpinene, limonene, cyclohexane, cyclooctane, gamma-terpinene, camphene, dimethylhexadiene, ethylbenzene, norbornadiene, cyclopentene oxide, 1,2,4-trimethylcyclohexane, 1,5-dimethyl-1,5-cyclooctadiene, camphene, adamantane, 1,3-butadiene, substituted dienes, and decahydronaphthelene.

6. The process of claim 1 wherein the silicon-containing mixture comprises the mixture (i).

7. The process of claim 6 wherein the first silicon-containing precursor is t least one compound selected from compounds represented by the following formulas: $HSi(OR^1)_3$, wherein $OR^1$ is independently a OH, a $C_1$ to $C_8$ linear or branched alkoxy or an acetate group and $Si(OR^2)_4$, wherein $OR^2$ is independently OH, a $C_1$ to $C_8$ linear or branched alkoxy, or an acetate group.

8. The process of claim 7 wherein the first silicon-containing precursor is at least one selected from triethoxysilane, tritertbutoxysilane, triemethyoxysilane, tri(tertiary)butoxysilanol, triacetoxysilane, tetra(tertiary)butoxysilane, tetraethoxysilane, tetramethoxysilane, and tetraacetoxysilane.

9. The process of claim 8 where the first silicon-containing precursor is triethoxysilane.

10. The process of claim 6 where the second silicon-containing precursor is an organosilane comprising at least one Si—C bond and optionally at least one bond selected from Si—O, O—H, C—O, Si—C, C—H, Si—Si, Si—F, and C—F bonds.

11. The process of claim 10 where the second silicon-containing precursor is at least one selected from diethoxymethylsilane, dimethoxymethylsilane, di(tertiary)butoxymethylsilane, methyltriacetatoxysilane, dimethylacetatoxysilane, dimethyldiacetoxysilane dimethyldimethoxysilane, dimethyldiethoxysilane, methyltriethoxysilane, neohexyltriethoxysilane, neopentyltrimethoxysilane, diacetoxymethylsilane, phenyldimethoxysilane, phenyldiethoxysilane, phenyltriethoxysilane, phenyltrimethoxysilane, phenylmethyldimethoxysilane, 1,3,5,7-tetramethyltetracyclosiloxane, octamethyltetracyclosiloxane, 1,1,3,3-tetramethyldisiloxane, 1-neohexyl-1,3,5,7-tetramethylcyclotetrasiloxane, hexamethyldisiloxane, 1,3-dimethyl-1-acetoxy-3-ethoxydisiloxane, 1,2-diemthyl-1,2-diacetoxy-1,2-diethoxydisilane, 1,3-dimethyl-1,3-diethoxydisiloxane, 1,3-dimethyl-1,3-diacetoxydisilxane, 1,2-dimethyl,1,1,2,2-tetraacetoxydisilane, 1,2-dimethyl-1,1,2,2-tetraethoxydisilane, 1,3-dimethyl-1-acetoxy-3-ethoxydisiloxane, 1,2-dimethyl-1-acetoxy-2-ethoxydisilane, methylacetoxy(tertiary)butoxysilane, methylsilane, dimethylsilane, trimethylsilane, tetramethylsilane, hexamethyldisilane, tetramethyldisilane, and dimethyldisilane.

12. The process of claim 11 where the second silicon-containing precursor is diethoxymethylsilane.

13. The process of claim 1 wherein the organosilicate film comprises Si—O, C—H, Si—C, and Si—H bonds.

14. The process of claim 13 where the organosilicate film comprises at least one bond selected from C—O, C=O, C—C, C=C, Si—F, C—F, and O—H.

15. The process of claim 1 wherein at least one oxidant is present during at least a portion of the applying step.

16. The process of claim 1 wherein reaction chamber is substantially free of at least one oxidant during the applying step.

17. The process of claim 1 wherein an at least one additive is present in the reaction chamber during at least a portion of the applying step.

18. The process of claim 17 wherein the at least one additive is selected from He, Ar, $N_2$, Kr, Xe, $NH_3$, $H_2$, $CO_2$, and CO.

19. The process of claim 1 wherein the silicon-containing mixture comprises diethoxymethylsilane, tetraethoxysilane, and the hydrocarbon is at least one selected from the group consisting of: alpha-terpinene, limonene, cyclooctane, cycloheptane, cyclohexane, norbornadiene, and cymene.

20. The process of claim 1 wherein at least one component of the mixture is maintained in a separate vessel prior to reaction in the reaction chamber.

21. The process of claim 20 wherein the separate vessel is a pressurizable vessel.

22. A process for making a porous organosilicate glass film having a dielectric constant of 3.0 or less and a C/Si ratio of 1 or less, the process comprising:

providing within a plasma enhanced chemical vapor deposition reaction chamber a substrate and a mixture comprising: a first silicon-containing precursor comprising from 3 to 4 Si—O bonds per Si atom, from 0 to 1 of a bond selected from a group consisting of Si—H, Si—Br, and Si—Cl bonds per Si atom, and no Si—C bonds; a second silicon-containing precursor comprising at least one Si—C bond per Si atom; and a hydrocarbon porogen, wherein the hydrocarbon porogen is plasma-polymerizable and is selected from the group consisting of:

(a) at least one cyclic hydrocarbon having a cyclic structure and the formula $C_nH_{2n}$, where n is a number ranging from 4 to 14, a number of carbons in the cyclic structure ranging from 4 to 10, and the at least one cyclic hydrocarbon optionally contains a plurality of simple or branched hydrocarbons substituted onto the cyclic structure;

(b) at least one linear or branched, saturated, singly or multiply unsaturated hydrocarbon of the general formula $C_nH_{(2n+2)+2y}$ where n is a number ranging from 2 to 20 and where y is a number ranging from 0 to n;

(c) at least one singly or multiply unsaturated cyclic hydrocarbon having a cyclic structure and the formula $C_nH_{2n-2x}$, where x is a number of unsaturated sites, n is a number ranging from 4 to 14, a number of carbons in the cyclic structure ranging from 4 to 10, and the at least one singly or multiply unsaturated cyclic hydrocarbon optionally contains a plurality of simple or branched hydrocarbons substituents substituted onto the cyclic structure, and contains endocyclic unsaturation or unsaturation on one of the hydrocarbon substituents;

(d) at least one bicyclic hydrocarbon having a bicyclic structure and the formula $C_nH_{2n-2}$, where n is a number ranging from 4 to 14, a number of carbons in the bicyclic structure ranging from 4 to 12, and the at least one bicyclic hydrocarbon optionally contains a plurality of simple or branched hydrocarbons substituted onto the bicyclic structure;

(e) at least one multiply unsaturated bicyclic hydrocarbon having a bicyclic structure and the formula $C_nH_{2n-(2+2x)}$, where x is a number of unsaturated sites, n is a number ranging from 4 to 14, a number of carbons in the bicyclic structure ranging from 4 to 12, and the at least one multiply unsaturated bicyclic hydrocarbon optionally contains a plurality of simple or branched hydrocarbons substituents substituted onto the bicyclic structure, and contains endocyclic unsaturation or unsaturation on one of the hydrocarbon substituents; and (f) at least one tricyclic hydrocarbon having a tricyclic structure and the formula $C_nH_{2n-4}$, where n is a number ranging from 4 to 14, a number of carbons in the tricyclic structure ranging from 4 to 12, and the at least one tricyclic hydrocarbon optionally contains a plurality of simple or branched hydrocarbons substituted onto the cyclic structure;

applying plasma energy to the mixture in the reaction chamber to induce a polymerization reaction and deposit a film on the substrate, wherein the film comprises a structure-former phase formed by the polymerization reaction of the silicon-containing precursors and a pore-former phase formed by the polymerization reaction of the hydrocarbon porogen; and treating the deposited film with at least one energy source selected from thermal, photon, electron, plasma, microwave, and chemical energy to remove at least a portion of the pore-former phase and provide the porous organosilicate glass film.

23. The process of claim 22 wherein the mixture has a number ratio of Si—C bonds to Si atoms that is less than 1.

24. The process of claim 22 wherein at least one oxidant selected from $O_2$, $N_2O$, NO, $NO_2$, $H_2O_2$, and ozone is introduced into the reaction chamber during at least a portion of the applying step.

25. A process for making an organosilicate glass film having a dielectric constant of 4.0 or less, the process comprising:
providing a silicon-containing mixture that is one selected from the following: a mixture (i) comprising a first silicon-containing precursor that comprises from 3 to 4 Si—O bonds per Si atom, from 0 to 1 of a bond selected from the group consisting of Si—H, Si—Br, or Si—Cl bonds per Si atom, and no Si—C bonds, and a second silicon-containing precursor that comprises at least one Si—C bond per Si atom; and a mixture (ii) comprising an asymmetric silicon-containing precursor having a number ratio of Si—C bonds to Si atoms that is less than 1;
adding a hydrocarbon porogen to the silicon-containing mixture;
introducing the silicon-containing mixture and the hydrocarbon porogen into a reaction chamber having a substrate contained therein; and
applying plasma energy to the mixture in the reaction chamber to induce a polymerization reaction and deposit the organosilicate glass film on the substrate by chemical vapor deposition, wherein the organosilicate glass film comprises a structure-former phase formed by the polymerization reaction of the silicon-containing mixture and a pore-former phase formed by the polymerization reaction of the hydrocarbon porogen.

26. The process of claim 25 further comprising treating the organosilicate glass film with at least one post-treating agent selected from the group consisting of thermal energy, plasma energy, photon energy, electron energy, microwave energy, and chemical treatments.

27. The process of claim 25 wherein the hydrocarbon porogen precursor is at least one selected from the group consisting of: alpha-terpinene, limonene, cyclohexane, cyclooctane, gamma-terpinene, camphene, dimethylhexadiene, ethylbenzene, norbornadiene, cyclopentene oxide, 1,2,4-trimethylcyclohexane, 1,5-dimethyl-1,5-cyclooctadiene, camphene, adamantane, 1,3-butadiene, substituted dienes, and decahydronaphthelene.

28. The process of claim 25 wherein the silicon-containing mixture comprises the mixture (i).

29. The process of claim 28 wherein the first silicon-containing precursor is at least one compound selected from compounds represented by the following formulas: $HSi(OR^1)_3$, wherein $OR^1$ is independently a OH, a $C_1$ to $C_8$ linear or branched alkoxy or an acetate group and $Si(OR^2)_4$, wherein $OR^2$ is independently OH, a $C_1$ to $C_8$ linear or branched alkoxy, or an acetate group.

30. The process of claim 29 wherein the first silicon-containing precursor is at least one selected from triethoxysilane, tritertbutoxysilane, triemethyoxysilane, tri(tertiary)butoxysilanol, triacetoxysilane, tetra(tertiary)butoxysilane, tetraethoxysilane, tetramethoxysilane, and tetraacetoxysilane.

31. The process of claim 30 where the first silicon-containing precursor is triethoxysilane.

32. The process of claim 28 where the second silicon-containing precursor is an organosilane comprising at least one Si—C bond and optionally at least one bond selected from Si—C, O—H, C—O, Si—C, C—H, Si—Si, Si—F, and C—F bonds.

33. The process of claim 32 where the second silicon-containing precursor is at least one selected from diethoxymethylsilane, dimethoxymethylsilane, di(tertiary)butoxymethylsilane, methyltriacetatoxysilane, dimethylacetatoxysilane, dimethyldiacetoxysilane dimethyldimethoxysilane, dimethyldiethoxysilane, methyltriethoxysilane, neohexyltriethoxysilane, neopentyltrimethoxysilane, diacetoxymethylsilane, phenyldimethoxysilane, phenyldiethoxysilane, phenyltriethoxysilane, phenyltrimethoxysilane, phenylmethyldimethoxysilane, 1,3,5,7-tetramethyltetracyclosiloxane, octamethyltetracyclosiloxane, 1,1,3,3-tetramethyldisiloxane, 1-neohexyl-1,3,5,7-tetramethylcyclotetrasiloxane, hexamethyldisiloxane, 1,3-dimethyl-1-acetoxy-3-ethoxydislioxane, 1,2-diemthyl-1,2-diacetoxy-1,2-diethoxydisilane, 1,3-dimethyl-1,3-diethoxydisiloxane, 1,3-dimethyl-1,3-diacetoxydisilxane, 1,2-dimethyl,1,1,2,2-tetraacetoxydisilane, 1,2-dimethyl-1,1,2,2-tetraethoxydisilane, 1,3-dimethyl-1-acetoxy-3-ethoxydisiloxane, 1,2-dimethyl-1-acetoxy-2-ethoxydisilane, methylacetoxy(tertiary)butoxysilane, methylsilane, dimethylsilane, trimethylsilane, tetramethylsilane, hexamethyldisilane, tetramethyldisilane, and dimethyldisilane.

34. The process of claim 33 where the second silicon-containing precursor is diethoxymethylsilane.

35. The process of claim 25 wherein the organosilicate film comprises Si—O, C—H, Si—C, and Si—H bonds.

36. The process of claim 35 where the organosilicate film comprises at least one bond selected from C—O, C=O, C—C, C=C, Si—F, C—F, and O—H.

* * * * *

UNITED STATES PATENT AND TRADEMARK OFFICE
CERTIFICATE OF CORRECTION

| | | |
|---|---|---|
| PATENT NO. | : 8,137,764 B2 | Page 1 of 1 |
| APPLICATION NO. | : 10/842503 | |
| DATED | : March 20, 2012 | |
| INVENTOR(S) | : Vincent et al. | |

It is certified that error appears in the above-identified patent and that said Letters Patent is hereby corrected as shown below:

Column 22, Line 59

In claim 7 delete "t" and insert -- at --

Column 25, Line 37

In claim 27 delete "precursor"

Signed and Sealed this
Eleventh Day of September, 2012

David J. Kappos
*Director of the United States Patent and Trademark Office*